(12) United States Patent
Ho et al.

(10) Patent No.: US 9,019,136 B2
(45) Date of Patent: Apr. 28, 2015

(54) SIGMA-DELTA MODULATORS WITH HIGH SPEED FEED-FORWARD ARCHITECTURE

(71) Applicant: MediaTek Inc., Hsin-Chu (TW)

(72) Inventors: Chen-Yen Ho, New Taipei (TW); Hung-Chieh Tsai, Guiren Township, Tainan County (TW); Yu-Hsin Lin, Taipei (TW)

(73) Assignee: MediaTek Inc., Hsin-Chu (TW)

( * ) Notice: Subject to any disclaimer, the term of this patent is extended or adjusted under 35 U.S.C. 154(b) by 0 days.

(21) Appl. No.: 14/097,451

(22) Filed: Dec. 5, 2013

(65) Prior Publication Data

US 2014/0159930 A1 Jun. 12, 2014

Related U.S. Application Data

(60) Provisional application No. 61/736,204, filed on Dec. 12, 2012.

(51) Int. Cl.
| | | |
|---|---|---|
| *H03M 3/00* | (2006.01) | |
| *H03M 1/00* | (2006.01) | |
| *H03M 1/12* | (2006.01) | |

(52) U.S. Cl.
CPC . *H03M 3/32* (2013.01); *H03M 3/30* (2013.01); *H03M 1/00* (2013.01); *H03M 1/12* (2013.01); *H03M 2201/4233* (2013.01); *H03M 3/452* (2013.01)

(58) Field of Classification Search
CPC . H03M 3/30; H03M 2201/4233; H03M 1/12; H03M 1/00

USPC .................................. 341/143, 166, 155, 156
See application file for complete search history.

(56) References Cited

U.S. PATENT DOCUMENTS

| | | | |
|---|---|---|---|
| 7,956,780 B2 | 6/2011 | Doerrer | |
| 2008/0062022 A1* | 3/2008 | Melanson | ..................... 341/143 |
| 2011/0163900 A1* | 7/2011 | Pagnanelli | ..................... 341/143 |

OTHER PUBLICATIONS

Matsukawa, K., et al.; "A 10 MHz BW 50 fJ/conv. Continuous Time ΔΣ Modulator with High-order Single Opamp Integrator using Optimization-based Design Method;" Symposium on VLSI Circuits Digest of Technical Papers; 2012; pp. 160-161.
Shu, Y.S., et al.; "A 65nm CMOS CT ΔΣ Modulator with 81dB DR and 8MHz BW Auto-Tuned by Pulse Injection;" ISSCC Session 27; Delta Sigma Converters 27.7; 2008; pp. 500-501, 631.
Park, M., et al.; "A 0.13um CMOS 78dB SNDR 87mW 20MHz BW CT ΔΣ ADC with VCO-Based Integrator and Quantizer," ISSCC Session 9; Data Converter Techniques 9.5; 2009; pp. 169-171.

* cited by examiner

*Primary Examiner* — Joseph Lauture
(74) *Attorney, Agent, or Firm* — McClure, Qualey & Rodack, LLP

(57) ABSTRACT

A sigma-delta modulator is provided for generating a digital output signal. The sigma-delta modulator is used to generate a digital output signal. The sigma-delta modulator includes a multi-stage loop filter and a quantizer. The multi-stage loop filter receives an analog input signal and generates an integrated output signal according to the analog input signal. The quantizer is coupled to the multi-stage loop filter. The quantizer receives the integrated output signal and quantizes the integrated output signal to generate the digital output signal. Different feed-forward paths of the sigma-delta modulator are available for different frequency bands.

16 Claims, 4 Drawing Sheets

SIGMA-DELTA MODULATORS WITH HIGH SPEED FEED-FORWARD ARCHITECTURE

CROSS REFERENCE TO RELATED APPLICATIONS

This application claims the benefit of U.S. Provisional Application No. 61/736,204, filed on Dec. 12, 2012, the contents of which are incorporated herein by reference.

BACKGROUND OF THE INVENTION

1. Field of the Invention

The invention relates to a sigma-delta modulator, and more particularly, to a continuous-time sigma-delta modulator (CT-SDM) with an additional feed-forward path specified for the high frequency signal components.

2. Description of the Related Art

For continuous-time sigma-delta modulators with high bandwidth and high sampling frequencies, the stability is the major design challenge. In general, compared with continuous-time sigma-delta modulators of feed-back types, continuous-time sigma-delta modulators with feed-forward topology save more power and area by replacing multiple feed-back digital-to-analog converters with feed-forward paths. A summing amplifier is necessary for a conventional continuous-time sigma-delta modulator with feed-forward topology. However, the configuration of the summing amplifier induces additional power. Thus, continuous-time sigma-delta modulators with AC-coupling or passive summing methods are provided to eliminate the above summing amplifier. Unfortunately, there are some drawbacks occurred in the continuous-time sigma-delta modulators with AC-coupling or passive summing methods, particularly for high sampling frequency prototypes: low stability, less driving capability for driving quantizers, and/or large power consumption.

BRIEF SUMMARY OF THE INVENTION

Thus, it is desirable to provide a sigma-delta modulator which provides an alternative feed-forward path for the high frequency signal components, such that the sigma-delta modulator has better stability for a high sampling frequency, large capability for driving a quantizer, and/or less power consumption.

An exemplary embodiment of a sigma-delta modulator is provided. The sigma-delta modulator is used to generate a digital output signal. The sigma-delta modulator comprises a multi-stage loop filter and a quantizer. The multi-stage loop filter receives an analog input signal and generates an integrated output signal according to the analog input signal. The quantizer is coupled to the multi-stage loop filter. The quantizer receives the integrated output signal and quantizes the integrated output signal to generate the digital output signal. Different feed-forward paths of the sigma-delta modulator are available for different frequency bands.

In an embodiment, a feed-forward path formed by a capacitive circuit is available for a signal with a frequency falling within a first frequency band. A feed-forward path formed by a resistive circuit is available for a signal with a frequency falling within a second frequency band which is lower than the first frequency band.

Another exemplary embodiment of a sigma-delta modulator is provided. The sigma-delta modulator is used to generate a digital output signal. The sigma-delta modulator comprises a multi-stage loop filter and a quantizer. The multi-stage loop filter receives an analog input signal and generates an integrated output signal between a first node and a second node according to the analog input signal. The quantizer is coupled to the multi-stage loop filter. The quantizer receives the integrated output signal and quantizing the integrated output signal to generate the digital output signal. The multi-stage loop filter comprises a plurality of summing paths, and different summing paths are available for different frequency bands.

In an embodiment, a summing path formed by a capacitive circuit is available for a signal with a frequency falling within a first frequency band. A summing path formed by a resistive circuit is available for a signal with a frequency falling within a second frequency band which is lower than the first frequency band.

An exemplary embodiment of a method for converting an analog signal to a digital output signal is provided. The method comprises the steps of receiving an analog input signal and generating an integrated output signal according to the analog input signal by a multi-stage loop filter of a sigma-delta modulator; quantizing the integrated output signal to generate the digital output signal by a quantizer of the sigma-delta modulator; providing different feed-forward paths of the sigma-delta modulator for different frequency bands.

In an embodiment, the step of providing different feed-forward paths of the sigma-delta modulator for different frequency bands comprises: providing a feed-forward path formed by a capacitive circuit for a signal with a frequency falling within a first frequency band; and providing a feed-forward path formed by a resistor circuit for a signal with a frequency falling within a second frequency band which is lower than the first frequency band.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
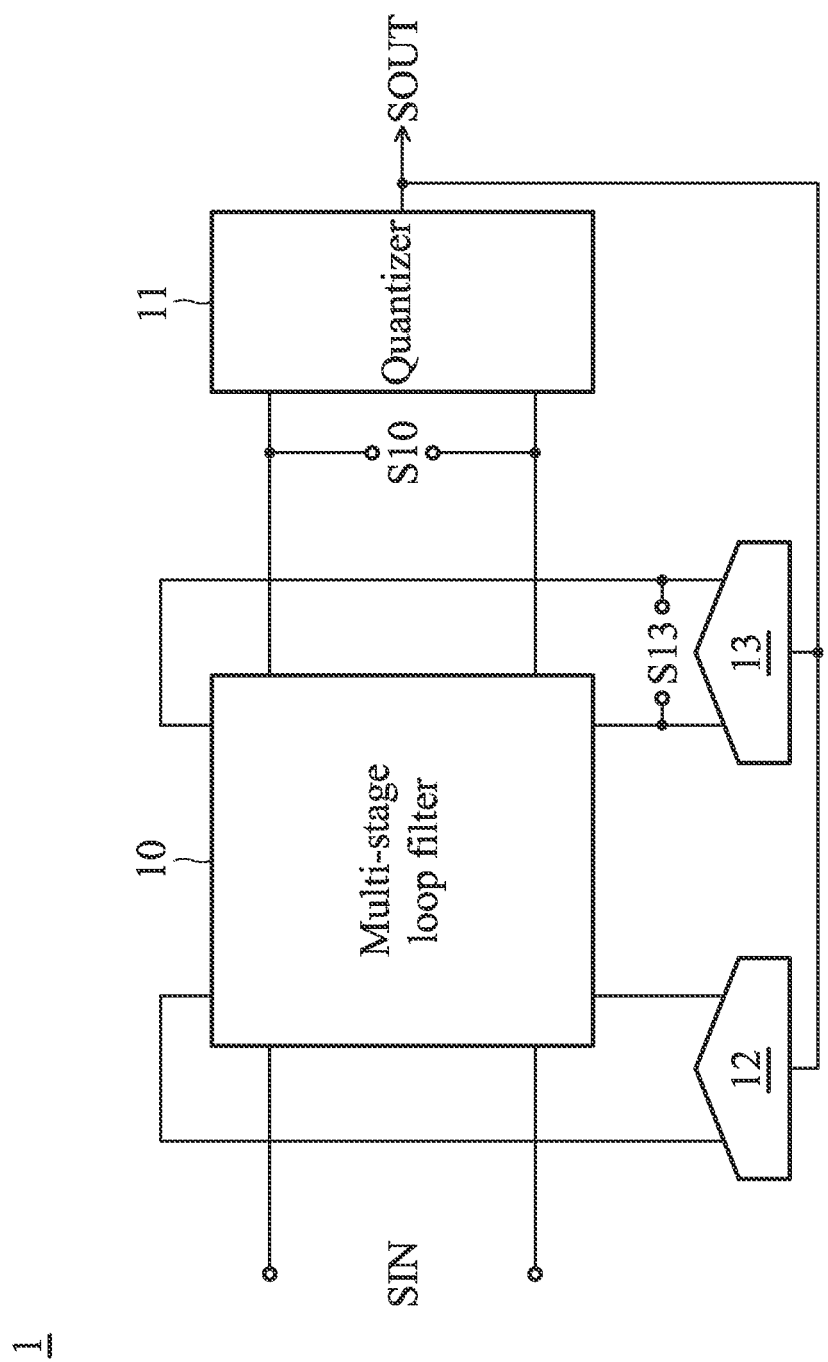
FIG. 1 shows an exemplary embodiment of a sigma-delta modulator.

FIG. 1 shows an exemplary embodiment of a sigma-delta modulator. Referring to FIG. 1, the sigma-delta modulator 1 comprises a multi-stage loop filter 10, a quantizer 11, and digital-to-analog converters (DACs) 12 and 13. The multi-stage loop filter 10 receives an analog input signal SIN and performs an integration operation to the analog input signal SIN to generate an integrated output signal S10 at output terminals of the multi-stage loop filter 10. The quantizer 11 receives the integrated output signal S10 and quantizes the integrated output signal S10 to generate a digital output signal SOUT. The digital output signal SOUT is transmitted to external circuits for digital processing. The digital output signal SOUT is also transmitted to the DAC 12 which converts the digital output signal SOUT back to an analog signal for the multi-stage loop filter 10. Accordingly, the sigma-delta modulator 1 operates as a closed loop. The DAC 13 receives the digital output signal SOUT and converts the digital output signal SOUT to an analog compensation signal S13 to compensate for excess loop delay.

Figure 2:
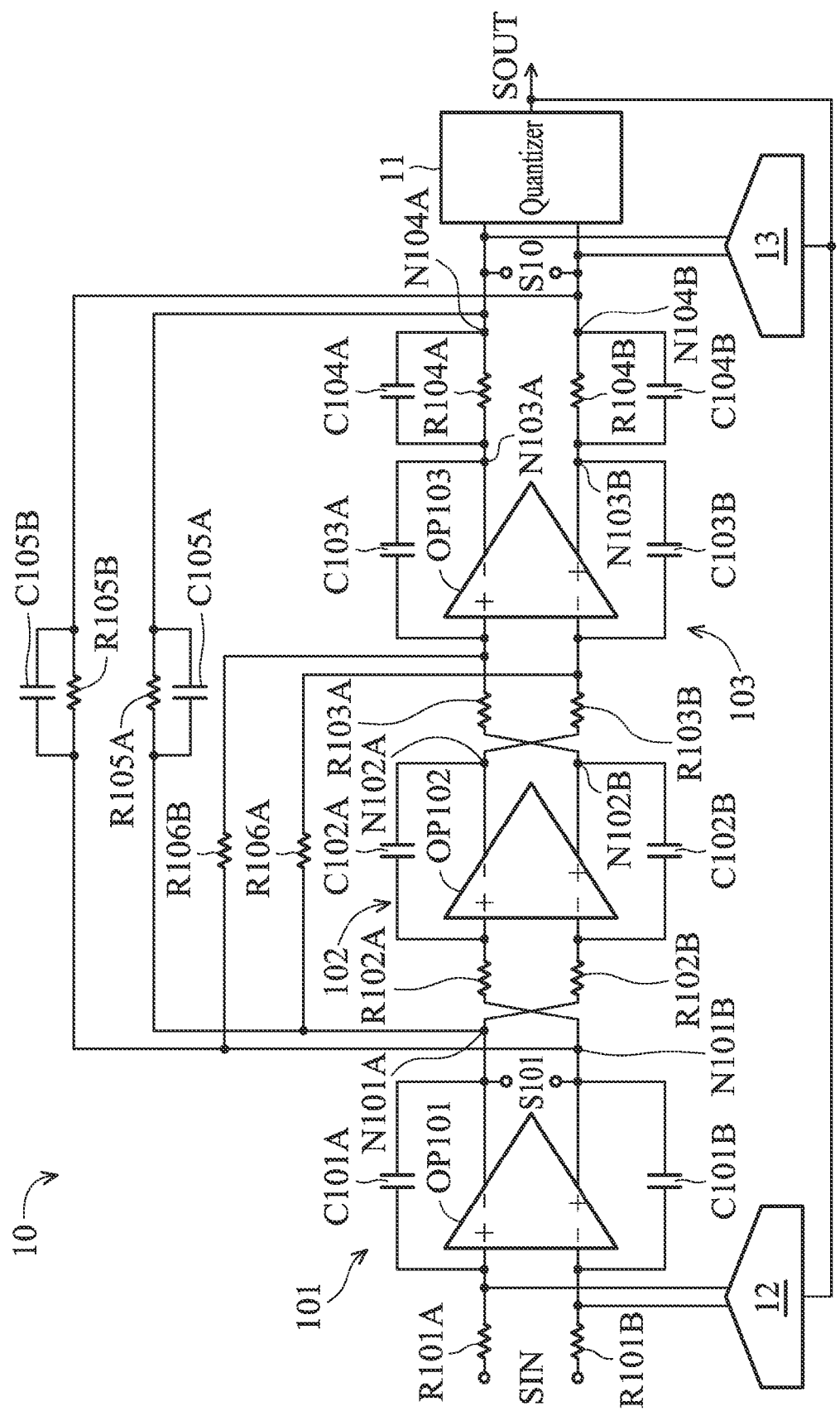
FIG. 2 shows another exemplary embodiment of a sigma-delta modulator.

In an embodiment, the sigma-delta modulator 1 is a fully-differential modulator. In other words, the multi-stage loop filter 10 is implemented by differential operational amplifiers. There are a plurality of stages of integrator circuits in the multi-stage loop filter 10 of the embodiment. According to the embodiment of FIG. 2, three stages are given as an example. In other embodiments, the number of stages of the integrator circuits is determined by system requirements, and the multi-stage loop filter 10 may comprise other circuits not shown in FIG. 2. In FIG. 2, the multi-stage loop filter 10 comprises resistors R101A, R101B, R102A, R102B, R103A, R103B, R104A, R104B, R105A, R105B, R106A, and R106B, capacitors C101A, C101B, C102A, C102B, C103A, C103B, C104A, C104B, C105A, and C105B, and operational amplifiers OP101-OP103. The operational amplifier OP101 has a positive (+) input terminal, a negative (−) input terminal, a positive output terminal, and a negative output terminal. The one terminal of the resistor R101A receives the analog input signal SIN, and the other terminal thereof is coupled to the positive input terminal of the operational amplifier OP101. The one terminal of the resistor R101B receives the analog input signal SIN, and the other terminal thereof is coupled to the negative input terminal of the operational amplifier OP101. The capacitor C101A is coupled between the positive input terminal and the negative output terminal of the operational amplifier OP101, and the capacitor C101B is coupled between the negative input terminal and the positive output terminal of the operational amplifier OP101. The resistors R101A and R101B, the capacitors C101A and C101B, and the operational amplifier OP101 form one stage 101 of the multi-stage loop filter 10; that is the first stage 101 among the three stages of the integrator circuits. Referring to FIG. 2, the negative output terminal of the operational amplifier OP101 is coupled to a node N101A, while the positive output terminal of the operational amplifier OP101 is coupled to a node N101B.

The operational amplifier OP102 has a positive (+) input terminal, a negative (−) input terminal, a positive output terminal, and a negative output terminal. The one terminal of the resistor R102A is coupled to the positive output terminal of the operational amplifier OP101 at the node N101B, and the other terminal thereof is coupled to the positive input terminal of the operational amplifier OP102. The one terminal of the resistor R102B is coupled to the negative output terminal of the operational amplifier OP101 at the node N101A, and the other terminal thereof is coupled to the negative input terminal of the operational amplifier OP102. The capacitor C102A is coupled between the positive input terminal and the negative output terminal of the operational amplifier OP102, and the capacitor C102B is coupled between the negative input terminal and the positive output terminal of the operational amplifier OP102. The resistors R102A and R102B, the capacitors C102A and C102B, and the operational amplifier OP102 form one stage 102 of the multi-stage loop filter 10; that is the second stage 102 among the three stages of the integrator circuits. Referring to FIG. 2, the negative output terminal of the operational amplifier OP102 is coupled to a node N102A, while the positive output terminal of the operational amplifier OP102 is coupled to a node N102B.

Referring to FIG. 2, the operational amplifier OP103 has a positive (+) input terminal, a negative (−) input terminal, a positive output terminal, and a negative output terminal. The one terminal of the resistor R103A is coupled to the positive output terminal of the operational amplifier OP102 at the node N102B, and the other terminal thereof is coupled to the positive input terminal of the operational amplifier OP103. The one terminal of the resistor R103B is coupled to the negative output terminal of the operational amplifier OP102 at the node N102A, and the other terminal thereof is coupled to the negative input terminal of the operational amplifier OP103. The capacitor C103A is coupled between the positive input terminal and the negative output terminal of the operational amplifier OP103, and the capacitor C103B is coupled between the negative input terminal and the positive output terminal of the operational amplifier OP103. The resistors R103A and R103B, the capacitors C103A and C103B, and the operational amplifier OP103 form one stage 103 of the multi-stage loop filter 10; that is the third stage 103 among the three stages of the integrator circuits. The negative output terminal of the operational amplifier OP103 is coupled to a node N103A, while the positive output terminal of the operational amplifier OP103 is coupled to a node N103B.

The capacitor C104A and the resistor R104A are coupled in parallel between the node N103A and a node N104A which is disposed before the quantizer 11. The capacitor C104B and the resistor R104B are coupled in parallel between the node N103B and a node N104B which is disposed before the quantizer 11. The capacitor C104A and the capacitor C104B form a summing path of the multi-stage loop filter 10, while the resistor R104A and the resistor R104B form another summing path of the multi-stage loop filter 10. The integrated output signal S10 is generate between the nodes N104A and N104B, which are the output terminals of the multi-stage loop filter 10. The resistor R106A is coupled between the negative output terminal of the operational amplifier OP101 (that is, the node N101A) and the negative input terminal of the operational amplifier OP103. The resistor R106B is coupled between the positive output terminal of the operational amplifier OP101 (that is, the node N101B) and the positive input terminal of the operational amplifier OP103.

The multi-stage loop filter 10 has a plurality of feed-forward paths. In the embodiment of FIG. 2, two feed-forward paths for the multi-stage loop filter 10 are given as an example. Referring to FIG. 2, one feed-forward path is formed by capacitive circuits such as the capacitors C105A and C105B. The capacitor C105A is coupled between the negative output terminal of the operational amplifier OP101 (that is, the node N101A) and the node N104A. The capacitor C105B is coupled between the positive output terminal of the operational amplifier OP101 (that is, the node N101B) and the node N104B. The other feed-forward path is formed by resistive circuits such as the resistors R105A and R105B. The resistor R105A is coupled to the capacitor C105A in parallel between the node N101A and the node N104A. The resistor R105B is coupled to the capacitor C105B in parallel between the node N101B and the node N104B. The feed-forward signals generated at the outputs of the feed-forward paths and the integrated signals generated by the three integrator circuits are summed by the summing paths to generate the integrated output signal S10.

Figure 3:
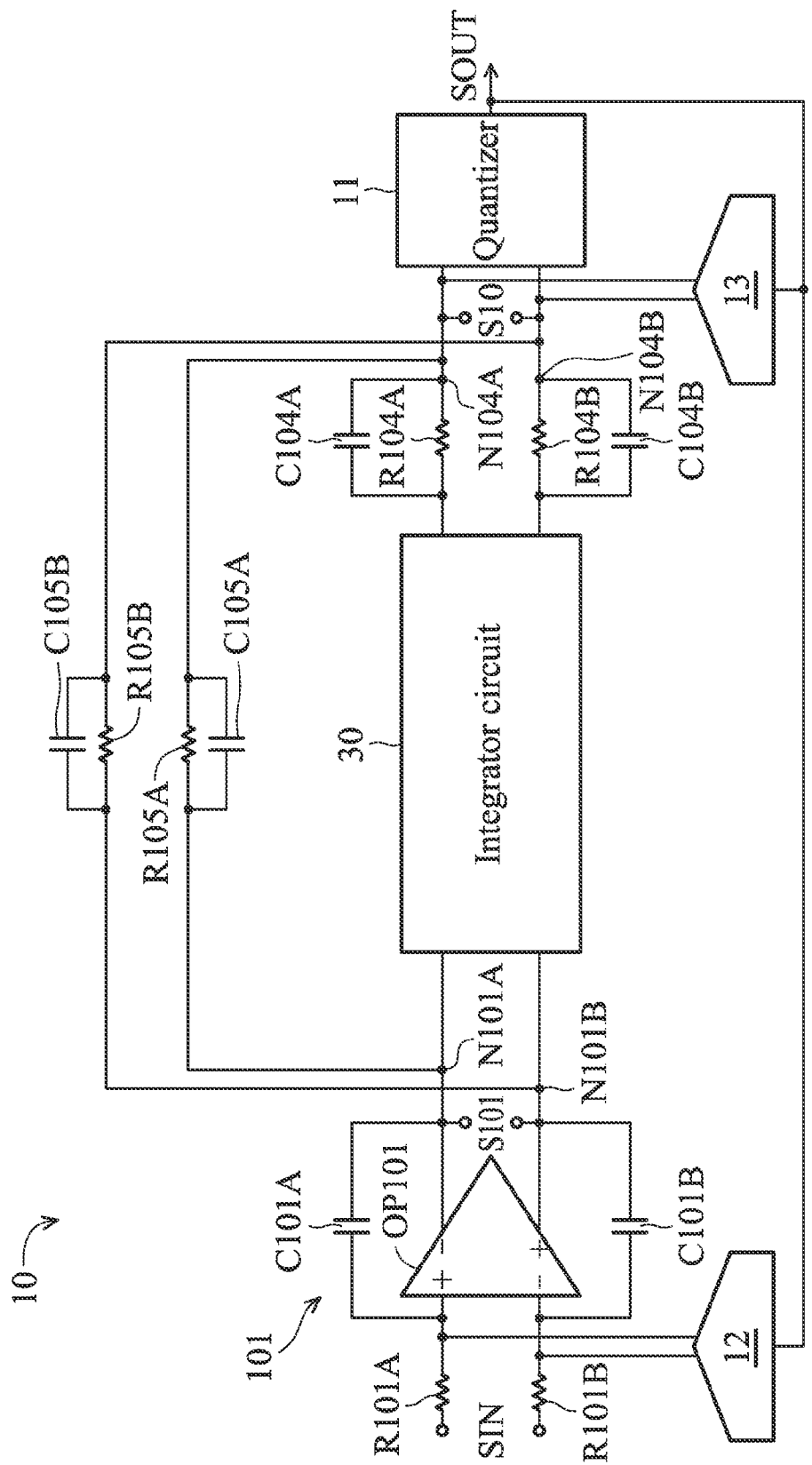
FIG. 3 show further another exemplary embodiment of a sigma-delta modulator.

In order to clearly illustrate the embodiment, the sigma-delta modulator 1 is simply shown by FIG. 3. In FIG. 3, an integrator circuit 30 comprises the other stages of the multi-stage loop filter 10 without the first stage 101. For example, the integrator circuit 30 comprises the other stages 102 and 103 of integrator circuits, and the resistors R106A and R106B.

Referring to FIG. 3, the two feed-forward paths of the sigma-delta modulator 1 are available for different frequency bands. The first stage 101 of the multi-stage loop filter 10 performs an integration operation to the analog input signal SIN to generate an integration signal S101 between the nodes N101A and N101B. The integration signal S101 will pass to the nodes N104A and N104B through both the integrator circuit 30 and the feed-forward paths. In this embodiment, the high frequency portion of the integration signal S101 will mainly pass through the feed-forward path formed by the capacitive circuit of the capacitors C105A and C105B, and the low frequency portion of the integration signal S101 will mainly pass through the feed-forward path formed by the resistive circuit of the resistors R105A and R105B. The high frequency portion of the integration signal output by the integrator circuit 30 will mainly pass through the summing path formed by the capacitive circuit of the capacitors C104A and C104B, and the low frequency portion thereof will mainly pass through the summing path formed by the resistive circuit of the resistors R104A and R104B. In this way, the design of the parasitic pole resulting from the resistors R104A and R104B loading the parasitic capacitance of the DAC 13 and the quantizer 11 becomes less stringent, and the impedance value of the resistors R104A and R104B can be large in order to enhance the integrator gain, the quantization noise suppression, and the loop stability for a high bandwidth/sampling rate design. Moreover, the current consumed by the DAC 13 can be decreased to save power consumption.

Figure 4:
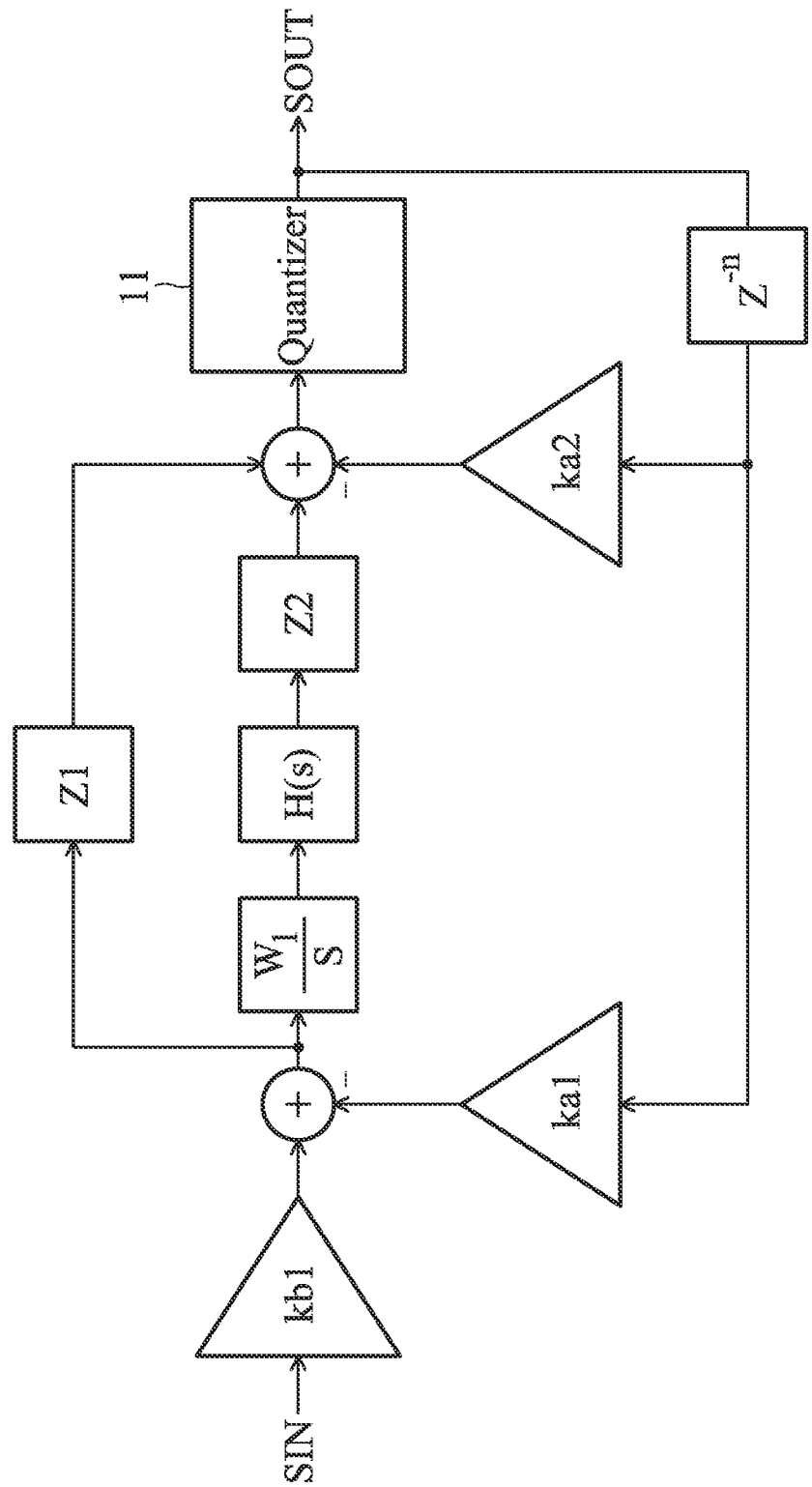
FIG. 4 shows a behavior model of a sigma-delta modulator according to an exemplary embodiment.

FIG. 4 shows the behavior model of the sigma-delta modulator 1. In FIG. 4, the coefficient kb1 represents the impedance of the resistors R101A and R101B. The coefficients ka1 and ka2 are induced by the behavior of the DACs 12 and 13 respectively. The coefficient $Z^{-n}$ represents the excess loop delay in the sigma-delta modulator 1. $\omega_1/S$ represents the transfer function of the first stage 101 of the multi-stage loop filter 10. H(s) represent the transfer function of the other stages of the multi-stage loop filter 10. Z1 represents the equivalent impedance of the feed-forward paths. Z2 represent the equivalent impedance of the summing paths. In the embodiments, the capacitors C105A and C105B have the same capacitance value Cff, and the resistors R105A and R105B have the same resistance value Rff. The capacitors C104A and C104B have the same capacitance value Cint, and the resistors R104A and R104B have the same resistance value Rint.

For low sampling frequency signal portion, Z1 is represented as follows:

$$Z1 = \frac{Rint}{Rff + Rint};$$

and $$Z2 = 1 - Z1.$$

For the high sampling frequency signal portion, Z1 is represented as follows:

$$Z1 = \frac{Cff}{Cff + Cint + Cq};$$

and $$Z2 = 1 - Z1,$$

where Cq represents the parasitic capacitance from both the DAC 13 and the quantizer 11.

In the sigma-delta modulator 1, the feed-forward paths between the nodes N101A and N101B and the nodes N104A and N104B mainly control the loop stability of the multi-stage loop filter 10. At the high sampling frequency, the feed-forward path formed by the capacitors C105A and C105B is available, and Z1 is not related to the resistors R104A and R104B (the resistance value Rint) and the resistors R105A and R105B (resistance value Rff). Thus, a pole induced by the equivalent input impedance and the equivalent parasitic capacitance Cq is not designed stringently, and the resistors R104A and R104B and the resistors R105A and R105B can have large resistance values. In this case, the loop stability of the multi-stage loop filter 10 operating at the high sampling frequency is not disadvantageously affected. Moreover, due to the resistors R104A and R104B with a large resistance value, the current flowing through the DAC 13 is less, thereby decreasing the power consumption. The resistors R104A and R104B with a large resistance value can also increase the capability of driving the quantizer 11.

According to the above embodiment, there are two feed-forward paths and two summing paths. One feed-forward path formed by a capacitive circuit is available for a signal with a frequency falling within a first frequency band (e.g., a high frequency band), while another feed-forward path formed by a resistive circuit is available for a signal with a frequency falling within a second frequency band (e.g., a low frequency band) which is lower than the first frequency band. One summing path formed by a capacitive circuit is available for a signal with a frequency falling within a first frequency band (e.g., a high frequency band), while another summing path formed by a resistive circuit is available for a signal with a frequency falling within a second frequency band (e.g., a low frequency band) which is lower than the first frequency band. Through the design of the two different feed-forward paths for two different frequency bands, the high frequency portion of the integration signal S101 mainly passes through the feed-forward path formed by the capacitive circuit rather than the resistive circuit, the resistance value Rint of the resistors R104A and R104B and the resistance value Rff of the resistors R105A and R105B can have large resistance values, which increase the capability of driving the quantizer 11 and decreasing the power consumption. Moreover, the stability of the sigma-delta modulator 1 is improved as well.

In addition, although the feed-forward paths in the above embodiments as coupled to the nodes N101A and N101B (that is, the output of the first stage integrator circuit 101), it is not meant to be a limitation of the present invention. The capacitive circuit comprising the capacitors C105A and C105B and the resistive circuit comprising the resistors R105A and R105B may couple between any node after the first stage 101 of the multi-stage loop filter 10 and the nodes N104A and N104B before the quantizer 11. For example, the feed-forward paths may be coupled between the outputs of the second stage integrator circuit 102 (e.g., the nodes N102A and N102B) and the nodes N104A and N104B, and the multi-stage loop filter 10 may comprise more than three stages of integrator circuit.

While the invention has been described by way of example and in terms of the preferred embodiments, it is to be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A sigma-delta modulator for generating a digital output signal, comprising:
   a multi-stage loop filter receiving an analog input signal and generating an integrated output signal according to the analog input signal; and
   a quantizer, coupled to the multi-stage loop filter, receiving the integrated output signal and quantizing the integrated output signal to generate the digital output signal;
   wherein different feed-forward paths of the sigma-delta modulator are available for different frequency bands.

2. The sigma-delta modulator as claimed in claim 1,
   wherein a feed-forward path formed by a capacitive circuit is available for a signal with a frequency falling within a first frequency band; and
   wherein a feed-forward path formed by a resistive circuit is available for a signal with a frequency falling within a second frequency band which is lower than the first frequency band.

3. The sigma-delta modulator as claimed in claim 2, wherein the capacitive circuit comprises a capacitor coupled between a first node after a first stage of the multi-stage loop filter and a second node before the quantizer.

4. The sigma-delta modulator as claimed in claim 3, wherein the resistive circuit comprises a resistor coupled between the first node and the second node.

5. The sigma-delta modulator as claimed in claim 1,
   wherein a first stage of the multi-stage loop filter has a first output terminal, and the multi-stage loop filter has a second output terminal where the integrated output signal is generated; and
   wherein the feed-forward paths comprises:
   a first capacitor coupled between the first output terminal and the second output terminal; and
   a first resistor coupled between the first output terminal and the second output terminal.

6. The sigma-delta modulator as claimed in claim 5, wherein a last stage of the multi-stage loop filter has a third output, and the multi-stage loop filter further comprises:
   a second capacitor coupled between the third output terminal and the second output terminal; and
   a second resistor coupled between the third output terminal and the second output terminal.

7. The sigma-delta modulator as claimed in claim 1, wherein different summing paths of the multi-stage loop filter are available for different frequency bands.

8. The sigma-delta modulator as claimed in claim 7, wherein the different summing paths are coupled between a last stage of the multi-stage loop filter and the quantizer.

9. The sigma-delta modulator as claimed in claim 7,
   wherein a summing path formed by a capacitive circuit is available for a signal with a frequency falling within a first frequency band; and
   wherein a summing path formed by a resistive circuit is available for a signal with a frequency falling within a second frequency band which is lower than the first frequency band.

10. A sigma-delta modulator for generating a digital output signal, comprising:
    a multi-stage loop filter receiving an analog input signal and generating an integrated output signal according to the analog input signal; and
    a quantizer, coupled to the multi-stage loop filter, receiving the integrated output signal and quantizing the integrated output signal to generate the digital output signal;
    wherein the multi-stage loop filter comprises a plurality of different summing paths, and the different summing paths are available for different frequency bands.

11. The sigma-delta modulator as claimed in claim 10, wherein the different summing paths are coupled between a last stage of the multi-stage loop filter and the quantizer.

12. The sigma-delta modulator as claimed in claim 10,
    wherein a summing path formed by a capacitive circuit is available for a signal with a frequency falling within a first frequency band; and
    wherein a summing path formed by a resistive circuit is available for a signal with a frequency falling within a second frequency band which is lower than the first frequency band.

13. A method for converting an analog signal to a digital output signal, comprising:
    receiving an analog input signal and generating an integrated output signal according to the analog input signal by a multi-stage loop filter of a sigma-delta modulator;
    quantizing the integrated output signal to generate the digital output signal by a quantizer of the sigma-delta modulator; and
    providing different feed-forward paths of the sigma-delta modulator for different frequency bands.

14. The method as claimed in claim 13, the step of providing the different feed-forward paths of the sigma-delta modulator comprises:
    providing a feed-forward path formed by a capacitive circuit for a signal with a frequency falling within a first frequency band; and
    providing a feed-forward path formed by a resistor circuit for a signal with a frequency falling within a second frequency band which is lower than the first frequency band.

15. The method as claimed in claim 14, wherein the capacitive circuit comprises a capacitor coupled between a first node after a first stage of the multi-stage loop filter and a second node before the quantizer.

16. The method as claimed in claim 15, wherein the resistive circuit comprises a resistor coupled between the first node and the second node.

* * * * *